April 12, 1966 D. D. BEYER 3,246,252
TWO STAGE TRANSISTOR PROGRESSIVE CASCADED VOLTAGE AMPLIFIER
Filed Jan. 3, 1964
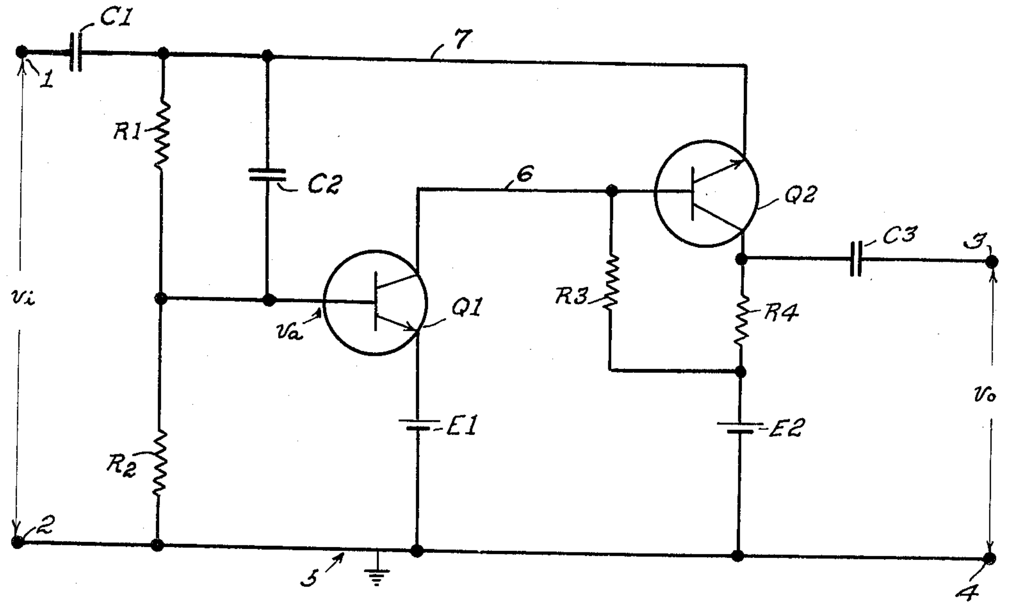
INVENTOR.
Duane D. Beyer
BY Harry M. Saragovitz,
Edward J. Kelly &
Herbert Berl United States Patent Office 3,246,252
Patented Apr. 12, 1966

3,246,252

TWO STAGE TRANSISTOR PROGRESSIVE CASCADED VOLTAGE AMPLIFIER

Duane D. Beyer, Sunnyvale, Calif., assignor to the United States of America as represented by the Secretary of the Army Filed Jan. 3, 1964, Ser. No. 335,697
1 Claim. (Cl. 330—19)

This invention relates to signal amplification devices and more particularly to a two-stage cascaded amplifier wherein the output of the first stage is used as the input to the second stage and the improvement therein consisting of circuit means whereby a greater output is obtained.

In the typical cascaded amplifier the total gain is equal to the product of the gain of each stage. In the cascaded amplifier of the invention the total A.C. gain is increased by applying the input signal at two places in the circuit so that the gain of the second stage is added to the product of the gain of each stage.

The specific nature of the invention and advantages thereof will clearly appear from the following description and sole drawing.

Referring now to the drawing numerals 1 and 2 indicate the input terminals to which is applied the input voltage $v_i$ and 3 and 4 indicate the output terminals across which the output voltage $v_o$ is taken. The circuit ground 5 is formed by an electrical conductor extending between terminals 2 and 4. Q1 is the three element transistor used as the common-emitter amplifier and Q2 is the three element transistor used in an approximate equivalent to a typical common-base amplifier of the first and second stages of the cascaded amplifier, respectively. Battery E2 which supplies the power for the circuit operation has one of its terminals connected to the circuit ground and its other terminal connected to the collector of transistor Q2 through the collector load resistor R4 and also to the collector of transistor Q1 through the base bias resistor R3 across which is developed the output signal of transistor Q1 for biasing the base of transistor Q2. A conductor 6 connects the collector of transistor Q1 with the base of transistor Q2 and resistor R3. E1 is the battery bias supply for transistor Q1 connected between circuit ground and the emitter of transistor Q1, its voltage being less than the voltage of battery E2. In practice a low impedance Zener diode may be substituted for battery E1 if the major portion of the Zener current is supplied by battery E2. Series connected resistors R1 and R2, comprising a voltage divider, are connected across the input terminals 1 and 2, resistor R1 being connected to terminal 1 through a capacitor C1. The junction formed by R1 and R2 is connected to the base of transistor Q1 whereby the input signal $v_i$ is coupled to the base of transistor Q1. The input signal $v_i$ is also applied to the emitter of transistor Q2 through conductor 7. A capacitor C2 is shunted across resistor R1. The voltages of batteries E1 and E2 and the values of resistors R1 and R2 are chosen so as to normally forward bias transistors Q1 and Q2. Capacitors C1 and C2 may be used to isolate direct current bias voltages, if necessary, from external equipment and are of such capacitance value so as to exhibit negligible impedance at the signal frequencies of interest. The capacitor C3 blocks the D.C. voltage from and couples the A.C. output voltage $v_o$, developed across resistor R4, to the output terminal 3.

The combination of resistors R1, R2, capacitor C2 and the input impedance of transistor Q1 have an associated voltage transfer function K which yields a voltage $$v_a = Kv_i$$

at the base of transistor Q1. The voltage $v_a$ will be inverted and amplified by the stage gain $A_1$ of the transistor Q1 and its associated circuitry. Thus a voltage $$-KA_1v_j$$

appears at the base of transistor Q2 and voltage $v_i$ appears at the emitter of transistor Q2. Although the voltage $-KA_1v_i$ and $v_i$ are in phase opposition with reference to circuit ground 5, both of these voltages are additive when referred to either the base or emitter of transistor Q2. That is, the input signal that transistor Q2 experiences is the difference between the signals at its base and emitter. Hence, $v_i-(-KA_1v_i)=v_i+KAv_i$ which is the sum of the voltages that constitute the input signal for transistor Q2 and is amplified by transistor Q2. The emitter input voltage of transistor Q2 is therefore equal to $v_i+KA_1v_i$ which when amplified by the stage gain $A_2$ of transistor Q2 and its associated circuitry becomes $v_o=A_2(1+KA_1)v_i$ at the output terminals 3 and 4. The total circuit gain is thus $A_T=A_2(1+KA_1)$ which therefore implies that K must be greater than $(A_1-1)/A_1$ in order to obtain more gain that the typical cascaded amplifier having a total gain of $A_1A_2$. That is, in a typical cascaded amplifier the transfer function $K=(A_1-1)/A_1$, thus $A_T=A_2A_1$ which is the maximum amplification factor for a typical cascaded amplifier. In accordance with the cascaded amplifier of the invention, K is set to a value larger than $(A_1-1)/A_1$ by selection of $R_1$, $R_2$ and $C_2$ values whereby $A_2(1+KA)_1$ is larger than $A_2A_1$ resulting in a larger gain than that of a typical cascaded amplifier. This requirement is met by selecting a value for C2 such that its impedance, at the lowest frequency of interest, will be many times less than the parallel combination of the resistance of R2 and the impedance of transistor Q1.

Since the emitter current of transistor Q2 serves to bias the base of transistor Q1, static or dynamic transistor variations will have less effect on bias levels than would be the case if negative D.C. feedback were not included.

Said negative D.C. feedback may best be described by, for example, assuming that the current in transistor Q2 tries to increase. This would cause the emitter voltage of transistor Q2 and hence the base of transistor Q1 to rise resulting in an increase in current in transistor Q1 which in turn lowers the base voltage of transistor Q2 and counteracts the rise in current of transistor Q2 first assumed, providing accordingly negative feedback.

I claim:

A signal amplifier including a first and second transistor, each of said transistors have emitter, collector and base electrodes, two input terminals, a circuit ground, a voltage divider comprising two series connected resistors having one end connected to one of the input terminals and the other end connected to the other of said input terminals, biasing means in series with the emitter of the first transistor and the circuit ground, the junction formed by the series connected resistors connected to the base electrode of the first transistor, a capacitor, said capacitor connected between said one of the input terminals and said junction, the collector electrode of the first transistor directly connected to the base electrode of the second transistor, first and second output terminals, the other of said input terminals and the second output terminal connected to the circuit ground, a power supply, the collector electrode of said second transistor connected to said circuit ground through a collector load resistor in series with said power supply, a bias resistor connected between the base electrode of said second transistor and said power supply circuit means connecting the emitter electrode of the second transistor to said one of the input terminals whereby a signal voltage is applied to the emitter electrode of said second transistor, said signal voltage also being applied to the base electrode of said first transistor whereby an amplified voltage is placed on the base electrode of said second transistor, said amplified voltage and said signal voltage comprising the input signal for said second transistor being in phase opposition with reference to the circuit ground, but additive with reference to either the emitter electrode or base electrode of said second transistor.

References Cited by the Examiner

UNITED STATES PATENTS 2,874,232 2/1959 Jochems ---------- 330—19 X
2,926,307 2/1960 Ehret ------------- 330—18 X

FOREIGN PATENTS 825,191 12/1959 Great Britain.

ROY LAKE, *Primary Examiner*.

F. D. PARIS, *Assistant Examiner*.